US012799589B2

(12) United States Patent
Ide et al.

(10) Patent No.: US 12,799,589 B2
(45) Date of Patent: Nov. 17, 2026

(54) ABATEMENT SYSTEM HAVING AN INJECTOR WITH A LIQUID MEMBRANE

(71) Applicant: HighVac Corporation, Colorado Springs, CO (US)

(72) Inventors: Neil Stephen Ide, Mandeville, LA (US); Philip J. Catalano, Dallas, TX (US); Joseph David Catalano, Colorado Springs, CO (US); Jason Whaley, Bells, TX (US)

(73) Assignee: HighVac Corporation, Colorado Springs, CO (US)

( * ) Notice: Subject to any disclaimer, the term of this patent is extended or adjusted under 35 U.S.C. 154(b) by 510 days.

(21) Appl. No.: 18/378,067

(22) Filed: Oct. 9, 2023

(65) Prior Publication Data

US 2025/0115994 A1 Apr. 10, 2025

(51) Int. Cl.
*C23C 16/44* (2006.01)

(52) U.S. Cl.
CPC ...... *C23C 16/4408* (2013.01); *C23C 16/4412* (2013.01)

(58) Field of Classification Search
CPC ............ B01D 53/79; B01D 2258/0216; C23C 16/4408; C23C 16/4412
See application file for complete search history.

(56) References Cited

U.S. PATENT DOCUMENTS

| | | | |
|---|---|---|---|
| 4,986,838 | A | 1/1991 | Johnsgard |
| 2004/0001787 | A1 | 1/2004 | Porshnev et al. |
| 2005/0135984 | A1 | 6/2005 | Ferron et al. |
| 2010/0064891 | A1 | 3/2010 | Johnsgard |
| 2014/0308187 | A1 | 10/2014 | Messineo et al. |
| 2020/0114402 | A1 | 4/2020 | Inada et al. |
| 2022/0349659 | A1 | 11/2022 | Messineo et al. |

FOREIGN PATENT DOCUMENTS

| | | |
|---|---|---|
| KR | 101661878 B1 | 10/2016 |

OTHER PUBLICATIONS

PCT International Search Report and Written Opinion for PCT/US2024/050509 dated Jan. 17, 2025.

*Primary Examiner* — Joseph A Miller, Jr.
(74) *Attorney, Agent, or Firm* — MOSER TABOADA

(57) ABSTRACT

Embodiments of methods and apparatus for an injector for an abatement system are provided herein. In some embodiments, an injector includes an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends between the inner wall and the outer wall to one or more first gas nozzles and a containment tube coupled to the inlet tube and disposed about the second end of the inlet tube, wherein the containment tube includes a liquid inlet port that is fluidly coupled to one or more first liquid nozzles and one or more second liquid nozzles.

17 Claims, 7 Drawing Sheets

ABATEMENT SYSTEM HAVING AN INJECTOR WITH A LIQUID MEMBRANE

FIELD

Embodiments of the present disclosure generally relate to abatement systems for semiconductor processing equipment.

BACKGROUND

Semiconductor manufacturing and processing can result in the expulsion of pyrophoric and reactive waste materials and by-products that can cause environmental harm if not removed prior to entering into the atmosphere. Systems for removing such waste materials and by-products are referred to as abatement systems. Certain waste materials, such as trichlorosilane (TCS), have a propensity to react rapidly with water moisture to form solid deposits. Gaseous moisture from the abatement system can diffuse into an inlet of the abatement system and react with waste gases and by-products such that inlet components of the abatement system can become covered in reactant material causing the abatement system to become clogged or experience sudden bursts of energy which results in damaged equipment, risk to operational personnel, and manufacturing downtime.

Accordingly, the inventors have provided herein embodiments of improved abatement systems.

SUMMARY

Embodiments of methods and apparatus for an injector for an abatement system are provided herein. In some embodiments, an injector for an abatement system includes an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends to the gap between the inner wall and the outer wall to one or more first gas nozzles configured to inject a first inert gas into the waste gas stream in a downward, radially inward, or downward and radially inward direction to create a compression zone for the waste gas stream; and a containment tube coupled to the inlet tube and disposed about the second end of the inlet tube, wherein the containment tube includes a liquid inlet port that is fluidly coupled to one or more first liquid nozzles configured to create a first liquid membrane in an interior volume of the containment tube and one or more second liquid nozzles configured to create a second liquid membrane in the interior volume radially outward of the first liquid membrane.

In some embodiments, an injector for an abatement system includes: an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends to the gap between the inner wall and the outer wall to one or more first gas nozzles configured to inject a first inert gas into the waste gas stream in a downward, radially inward, or downward and radially inward direction to create a compression zone for the waste gas stream; and a containment tube coupled to the inlet tube and disposed about the second end of the inlet tube, wherein the containment tube includes a liquid inlet port that is fluidly coupled to one or more first liquid nozzles configured to create a cylindrical liquid curtain in an interior volume of the containment tube to provide a liquid barrier for the waste gas stream downstream of the inlet tube, and wherein the liquid inlet port is fluidly coupled to one or more second liquid nozzles configured to flow a liquid along an inner sidewall of the containment tube downstream of the inlet tube.

In some embodiments, a method of abating liquid soluble waste gases and byproducts from a chemical or industrial process includes: forming a liquid membrane via one or more liquid nozzles within an interior volume of an injector; and flowing a waste gas stream through an inlet of the injector and through the liquid membrane, wherein the liquid membrane is formed downstream of the inlet, and wherein the liquid membrane allows diffusion of non-reactive waste gas of the waste gas stream through the membrane while trapping a reactive waste gas in the liquid membrane to reduce deposits on sidewalls of the injector.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
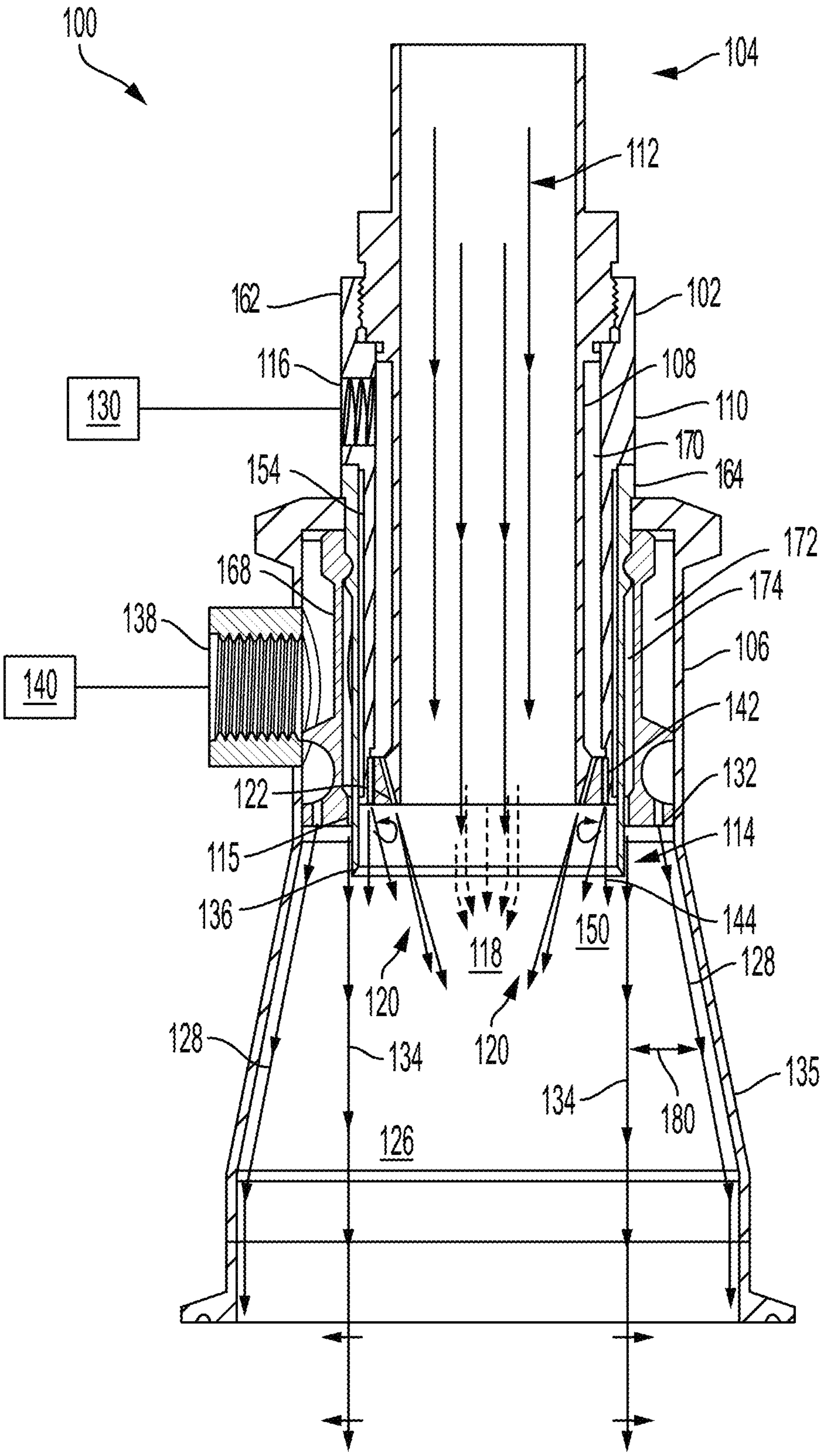
FIG. 1 depicts a cross-sectional side view of an injector for an abatement system in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for improved abatement of waste materials and processing by-products generated during microelectronic and thin film fabrication processes. The methods and apparatus advantageously prevent the diffusion of moisture into an abatement system inlet and promote rapidly reacting liquid soluble waste gases and by-products with liquid phase reactants and not gaseous phase reactants. An injector is disposed at the abatement system inlet and is generally configured to flow waste materials and processing by-products to components of the abatement system, such as to a scrubber of the abatement system. By preventing the diffusion of gaseous phase reactants into the abatement system inlet, the location of the chemical reaction can be controlled to prevent solid deposits on surfaces of the injector of the abatement system. The reduction or prevention of solid deposits in the injector advantageously reduces the need for injector surfaces to be cleaned and thus increases tool longevity and reduces tool downtime.

The injector generally includes one or more nozzles, jets, or the like, to form a substantially annular and continuous liquid membrane, or barrier layer, downstream of an inlet of the injector. The liquid membrane is spaced from inner sidewalls of the injector. A waste material stream passes through the waste material inlet of the injector to the liquid membrane. Upon contact between the waste material stream and the liquid membrane, a chemical reaction takes place between the liquid membrane and some of the compounds in the waste material stream, creating solid particles. However, the solid particles are substantially flushed out of the abatement system via the liquid membrane without depositing onto the inner sidewalls of the injector.

Figure 2:
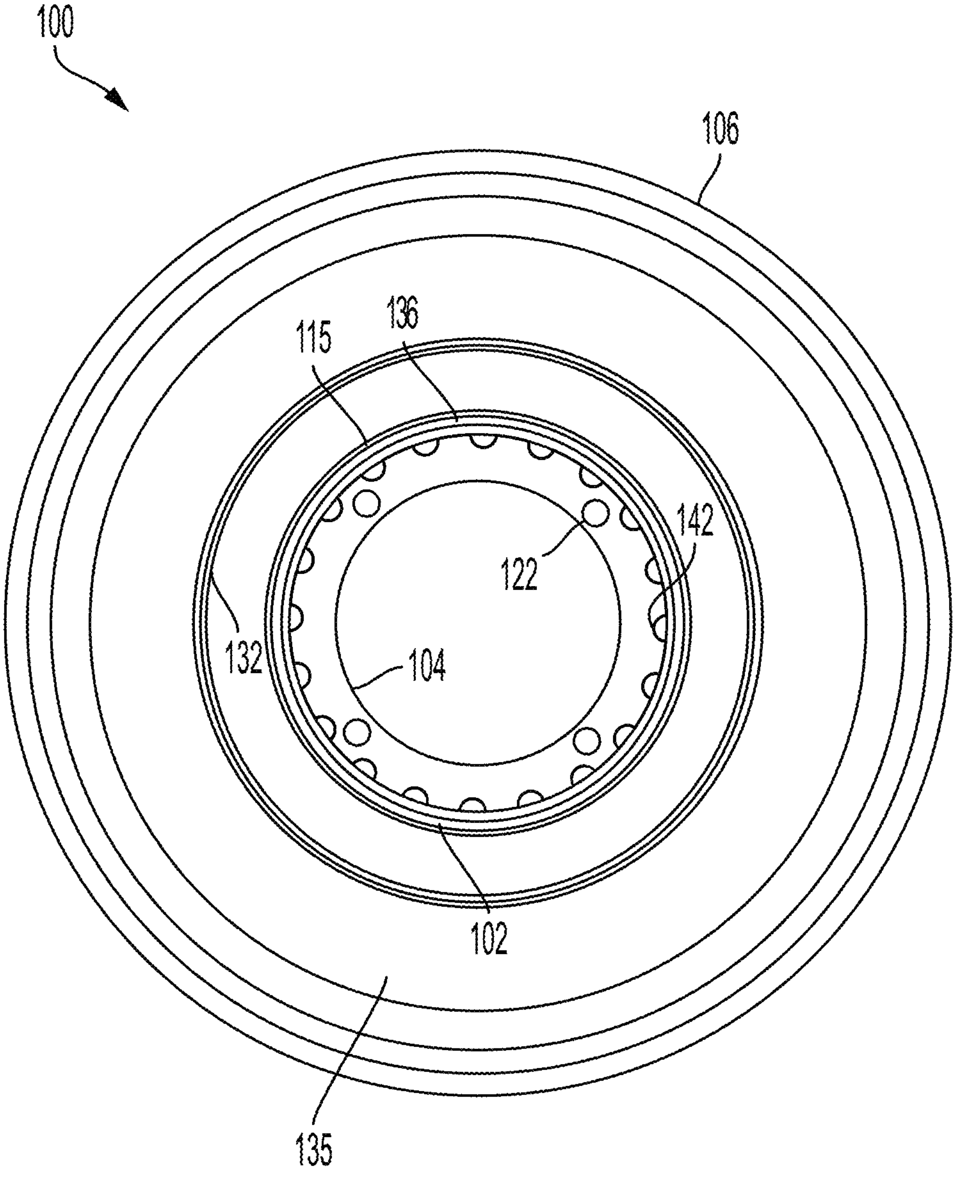
FIG. 2 depicts a bottom view of an injector for an abatement system in accordance with at least some embodiments of the present disclosure.

FIG. 1 depicts a schematic cross-sectional side view of an injector 100 for an abatement system in accordance with at least some embodiments of the present disclosure. FIG. 2 depicts a bottom view of an injector for an abatement system in accordance with at least some embodiments of the present disclosure. The injector 100 generally comprises an inlet tube 102 coupled to a containment tube 106. The inlet tube 102 includes an inner wall 108 and an outer wall 110 and a gap 170 disposed therebetween. The inner wall 108 defines a flow path therein for a waste gas stream 112 from a waste gas inlet 104, or first end of the inlet tube 102, towards a waste gas outlet 114, or second end of the inlet tube 102.

The outer wall 110 may comprise one or more tubular conduits. For example, the outer wall 110 may include an upper tube 162 and a lower tube 164. In some embodiments, the upper tube 162 is coupled to the inlet tube 102. The lower tube 164 may be disposed about and coupled to the upper tube 162. In some embodiments, the lower tube 164 defines a lowermost end of the inlet tube 102. In some embodiments, a lowermost surface of the upper tube 162 is substantially coplanar with a lowermost surface of the inner wall 108. The gap 170 may be defined between an outer surface of the inner wall 108 and an inner surface of the upper tube 162.

The waste gas inlet 104 of the inlet tube 102 is coupled to a process chamber (not shown) to receive the waste gas stream 112. The process chamber may be configured for physical vapor deposition, epitaxial vapor deposition, atomic layer deposition, chemical vapor deposition, etching, or the like. Although described as a gas stream, the waste gas stream 112 may comprise one or more gases, one or more liquids, or a combination of one or more gases and one or more liquids. In some embodiments, the waste gas stream 112 includes at least one of trichlorosilane, dichlorosilane, tetraethoxysilane, arsine, anhydrous ammonia, trimethylphosphine, trimethylaluminum, or tungsten.

The inlet tube 102 includes an inert gas inlet 116 that extends to the gap 170 between the inner wall 108 and the outer wall 110 to one or more first gas nozzles 122. The inert gas inlet 116 may be coupled to a gas source 130. The gas source 130 may contain one or more inert gases such as nitrogen, helium, or the like. The one or more first gas nozzles 122 are configured to inject a first inert gas 120 from the gas source 130 into the waste gas stream 112. In some embodiments, the first inert gas 120 is inject in an axial direction, such as a downward direction to create a compression zone 118 for the waste gas stream 112. In some embodiments, the one or more first gas nozzles 122 are configured to inject the first inert gas 120 into the waste gas stream 112 in a radially inward direction to create the compression zone 118 for the waste gas stream 112. In some embodiments, the one or more first gas nozzles 122 are configured to inject the first inert gas 120 into the waste gas stream 112 in a downward and a radially inward direction to create a compression zone 118 for the waste gas stream 112. The first inert gas 120 is configured to compress the waste gas stream 112 to reduce or prevent scattering of waste gas particles as the waste gas stream 112 flows past the compression zone 118.

The containment tube 106 is coupled to a lower portion of the inlet tube 102 and disposed about the waste gas outlet 114 of the inlet tube 102. The containment tube 106 includes a liquid inlet port 138 that is fluidly coupled to one or more first liquid nozzles 115. A liquid source 140 is coupled to the liquid inlet port 138. In some embodiments, the containment tube 106 includes an inner tube 168 disposed about the upper tube 162 and the lower tube 164 of the inlet tube 102. In some embodiments, the liquid inlet port 138 and the inner tube 168 form a first liquid plenum 172 therebetween. In some embodiments, the inner tube 168 and the lower tube 164 form a second liquid plenum 174 therebetween. The liquid source 140 may comprise water.

The one or more first liquid nozzles 115 are configured to create a first liquid membrane 134 in an interior volume 126 of the containment tube 106. The first liquid membrane 134 is formed via a continuous flow of liquid from the liquid source 140 through the second liquid plenum 174 through the one or more first liquid nozzles 115. For example, the first liquid membrane 134 may be a hollow cylindrical liquid curtain in the interior volume 126 to provide a liquid barrier for the waste gas stream downstream of the inlet tube 102. In some embodiments, the one or more first liquid nozzles 115 may comprise a single annular nozzle to create the hollow cylindrical liquid curtain.

The liquid barrier is disposed away from the inner sidewalls 135 to create space therebetween. The liquid barrier advantageously reacts with portions, such as toxic or volatile portions, of the waste gas stream 112 to form solid byproducts and flushes the solid byproducts along with the liquid barrier and away from the inner sidewalls 135, thereby minimizing deposits of solid byproducts onto walls and surfaces, such as inner sidewalls 135 of the injector 100. For example, if the waste gas stream 112 includes trichlorosilane ($HCl_3Si$) and the first liquid membrane 134 includes water, the trichlorosilane ($HCl_3Si$) may react with the water ($H_2O$) to form silicon dioxide ($SiO_2$) and hydrochloric acid (HCl), which are flushed out of the containment tube 106 with the first liquid membrane 134. Solid byproducts, such as silicon dioxide ($SiO_2$) tend to form solid deposits onto walls and surfaces. However, the reaction of trichlorosilane ($HCl_3Si$) with water ($H_2O$) away from the inner sidewalls 135 and away from the inlet tube 102 advantageous reduces or prevents solid deposits onto the walls and surfaces of the injector 100.

In some embodiments, the waste gas outlet 114 is beveled to create a forming tip 136 for the first liquid membrane 134 to minimize the effect of fluid surface tension on the first liquid membrane 134. In some embodiments, the forming tip 136 is a lowermost portion of the outer wall 110. In some embodiments, the forming tip 136 is defined by the lower tube 164. The first liquid membrane 134 may be made of water. In some embodiments, a diameter of the first liquid membrane 134 is similar to a diameter of the waste gas outlet 114, or second end, of the inlet tube 102.

In some embodiments, the first inert gas 120 can be heated prior to entry to the inlet tube 102. A lower end of the upper tube 162 of the inlet tube 102 may include a barrier portion 154 disposed between the inert gas inlet 116 and the liquid inlet port 138. The first inert gas 120 that is heated may be insulated from the relatively colder fluid from the liquid source 140 via the barrier portion 154. The lower tube 164 may provide additional insulation between the colder fluid from the liquid source 140 and the warmer gas from the gas source 130. The first inert gas 120 that is heated in turn heats the inner wall 108 which reduces the growth rate of metastable and pyrophoric compounds in the injector 100.

In some embodiments, the containment tube 106 includes one or more second liquid nozzles 132 configured to create a second liquid membrane 128 in the interior volume 126 radially outward of the first liquid membrane 134. The second liquid membrane 128 is generally formed via a flow of liquid from the liquid source 140 through the first liquid plenum 172 through the one or more second liquid nozzles 132. The second liquid membrane 128 generally runs along or proximate an inner sidewalls 135 of the containment tube 106. In some embodiments, the inner sidewalls 135 extends downward and radially outward downstream of the inlet tube 102. In some embodiments, a distance 180 between the first liquid membrane 134 and the second liquid membrane 128 varies within the containment tube 106.

In some embodiments, the inlet tube 102 includes one or more second gas nozzles 142 disposed radially outward of the one or more first gas nozzles 122 and configured to inject a second inert gas 144 into a region 150 between the compression zone 118 and the first liquid membrane 134. In some embodiments, the second inert gas 144 is a same gas as the first inert gas 120.

In use, the waste gas stream 112 enters the injector 100 via the waste gas inlet 104 of the inlet tube 102. The first liquid membrane 134 is generated downstream of the inlet tube 102. The waste gas stream 112 may be compressed via the first inert gas 120 in the compression zone 118 before expanding again downstream of the compression zone 118. The compression zone 118 may be used to control a location of reaction between the reactive components of the waste gas stream 112 and the first liquid membrane 134. For example, the location of reaction being further away from surfaces of the injector 100, such as the inlet tube 102, reduces unwanted deposits onto surfaces of the injector 100.

Downstream of the compression zone 118, the first liquid membrane 134 enables the reaction of reactive components of the waste gas stream 112 without being closely coupled with a solid surface, therefore further protecting the nucleation sites where reactant materials can form into solid deposits. Thus, the first liquid membrane 134 maintains components, or solid deposits, suspended in solution in a slurry to be washed down into the fluid bed. A carrier gas such as hydrogen gas may go through the first liquid membrane 134 due to the small size of the hydrogen gas molecules. Thus, the carrier gas in the waste gas stream 112 may aid in bringing reactive components from the waste gas stream 112 to the first liquid membrane 134.

In some embodiments, injecting the second inert gas 144 into the region 150 between the compression zone 118 and the first liquid membrane 134 may prevent any moisture from the first liquid membrane 134 or gases and by-products from the waste gas stream 112 from being drawn back to nucleate on the one or more first gas nozzles 122 or the one or more second gas nozzles 142. In some embodiments, the second liquid membrane 128 may be used to react with any other possible reactive components from the waste gas stream 112 that escape radially outward of the first liquid membrane 134 and flush any remaining solid deposits.

Figure 3:
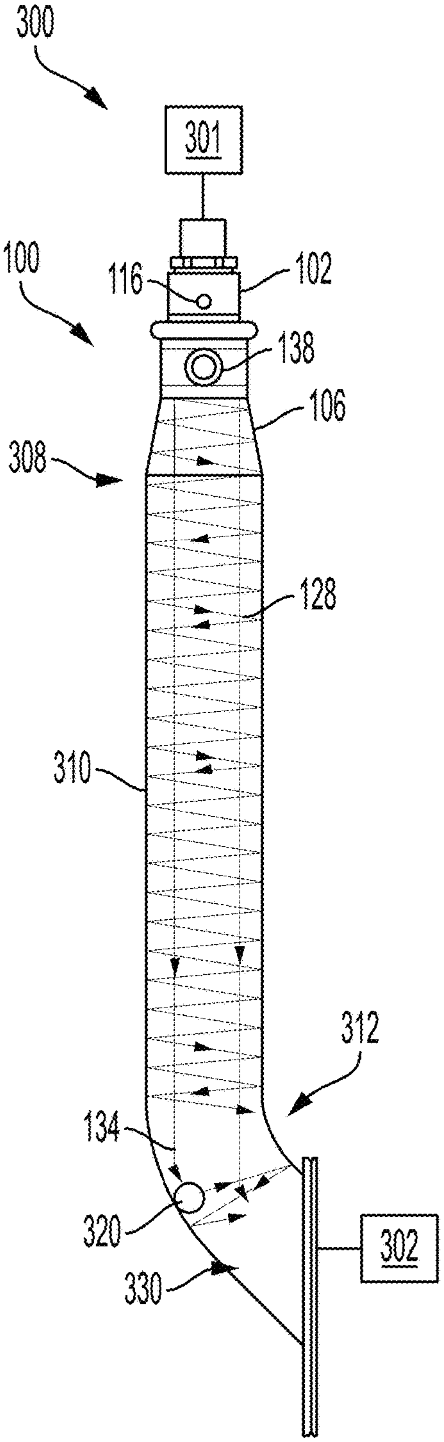
FIG. 3 depicts a schematic side view of an injector for an abatement system in accordance with at least some embodiments of the present disclosure.

FIG. 3 depicts a schematic side view of an injector 100 for an abatement system 300 in accordance with at least some embodiments of the present disclosure. The abatement system 300 may include a process chamber 301, the injector 100 coupled to the process chamber 301 downstream of the process chamber 301, and a scrubber 302 coupled to the injector 100 downstream of the injector 100. The scrubber 302 may be any suitable scrubber used in semiconductor fabrication.

In some embodiments, the injector 100 includes a mounting tube 310 coupled to a lower end 308 of the containment tube 106 to facilitate coupling the injector 100 to the scrubber 302. A length of the mounting tube 310 is suitably long enough to allow for reactants in the waste gas stream 112 to interact with the first liquid membrane 134 and to prevent any turbulent effects from being carried upstream to the containment tube 106. In some embodiments, the mounting tube 310, as depicted in FIG. 3, includes a bend 312. In some embodiments, the mounting tube 310 is substantially linear with no bends. In some embodiments, a spin flush nozzle 320 is disposed in the mounting tube 310 proximate a base 330 of the first liquid membrane 134. The spin flush nozzle 320 may provide a fluid to aid in flushing fluid and solid byproducts from the first liquid membrane 134 from the mounting tube 310 and directing fluid and solid byproducts to the scrubber 302 so that the solid byproducts do not deposit onto inner walls of the mounting tube 310. In some embodiments, fluid from the spin flush nozzle 320 comprises water.

The fluid from the spin flush nozzle 320 may advantageously react with any remaining toxic or volatile portions of the waste gas stream at the base 330 of the first liquid membrane 134. For example, the fluid from the spin flush nozzle 320 may react with any remaining trichlorosilane ($HCl_3Si$) disposed in the first liquid membrane 134. The spin flush nozzle 320 may be configured for directing fluid substantially tangentially to an inner surface of the mounting tube 310 to flow along inner sidewalls of the mounting tube 210 to reduce or prevent solid byproducts from depositing onto the inner sidewalls of the mounting tube 210.

Figure 4:
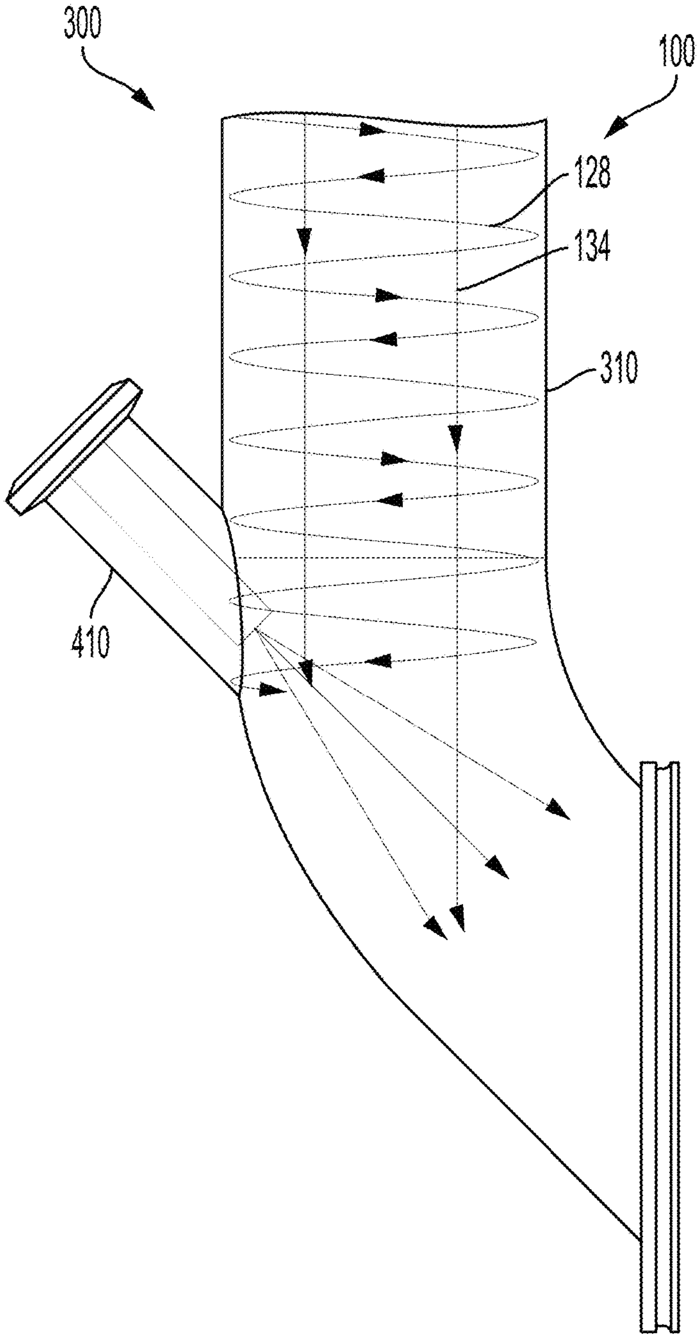
FIG. 4 depicts a schematic side view of a lower portion of an injector for an abatement system in accordance with at least some embodiments of the present disclosure.

FIG. 4 depicts a schematic side view of a lower portion of an injector 100 for an abatement system 300 in accordance with at least some embodiments of the present disclosure. In some embodiments, the mounting tube 310 may include a cone flush nozzle 410 configured to spraying fluid within the mounting tube 310 in a cone shaped manner so that the fluid contacts a circumference of the inner surfaces of the mounting tube 310 downstream of the cone flush nozzle 410. In some embodiments, the mounting tube 310 may include the spin flush nozzle 320 and the cone flush nozzle 410. In some embodiments, the mounting tube 310 does not include either the spin flush nozzle 320 or the cone flush nozzle 410.

Figure 5:
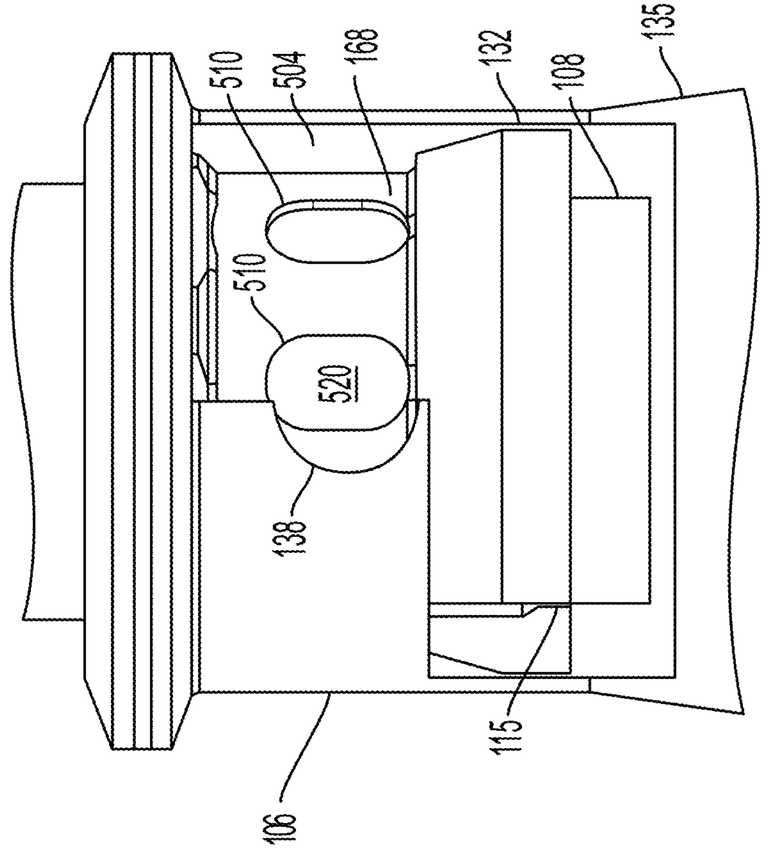
FIG. 5 depicts a partial sectional side view of a portion of an injector for an abatement system in accordance with at least some embodiments of the present disclosure.

FIG. 5 depicts a partial section side view of a portion of an injector 100 for an abatement system in accordance with at least some embodiments of the present disclosure. FIG. 5 cuts through a portion of the containment tube 106 proximate the liquid inlet port 138 to aid in viewing the inner tube 168 and the one or more first liquid nozzles 115. In some embodiments, the liquid inlet port 138 is fluidly coupled to the one or more first liquid nozzles 115 via a plurality of distribution ports 510 disposed radially inward of the liquid inlet port 138. In some embodiments, the plurality of distribution ports 510 are formed through the inner tube 168. In some embodiments, the liquid inlet port 138 extends into a first volume 504, or the first liquid plenum 172, that supplies fluid into the one or more second liquid nozzles 132. In some embodiments, a second volume 520, or the second liquid plenum 174, is disposed radially inward of the plurality of distribution ports 510 and in fluid communication with the first volume 504 and is configured to supply fluid into the one or more first liquid nozzles 115. As depicted in FIG. 5, the one or more second liquid nozzles 132 comprise a straight flush jet that injects liquid in a straight manner with no spinning motion.

Figure 6:
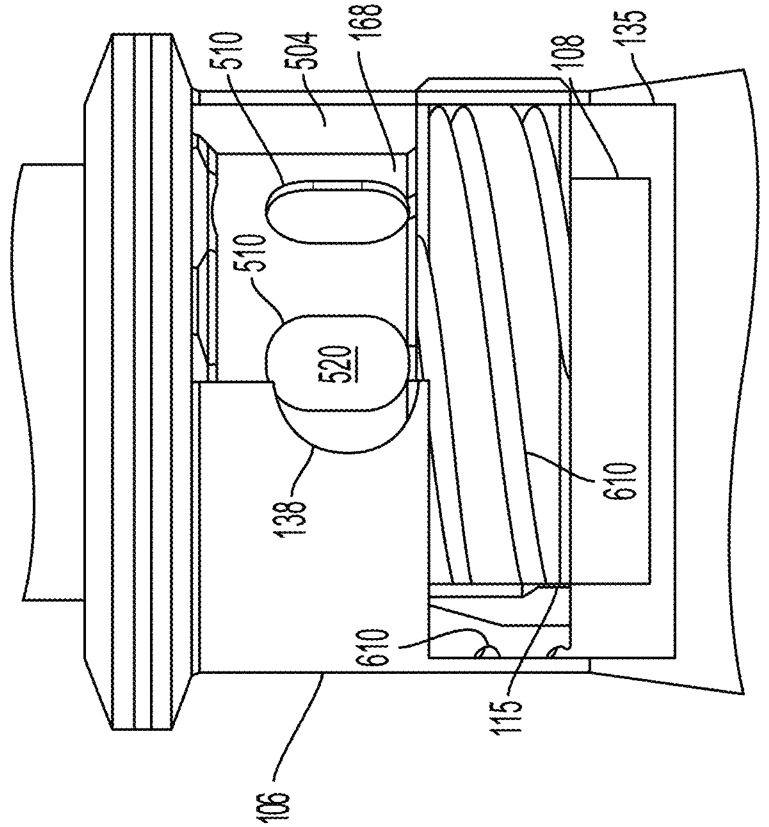
FIG. 6 depicts a partial sectional side view of a portion of an injector for an abatement system in accordance with at least some embodiments of the present disclosure.

FIG. 6 depicts a partial section side view of a portion of an injector for an abatement system in accordance with at least some embodiments of the present disclosure. FIG. 5 cuts through a portion of the containment tube 106 proximate the liquid inlet port 138 to aid in viewing the inner tube 168 and the one or more first liquid nozzles 115. As depicted in FIG. 6, the containment tube 106 includes a spiral channel 610 disposed below the plurality of distribution ports 510 so that the one or more second liquid nozzles 132 may inject fluid in a centrifugal manner therethrough. In some embodiments, the second liquid membrane 128 is formed via liquid flowing through the spiral channel 610.

Figure 7:
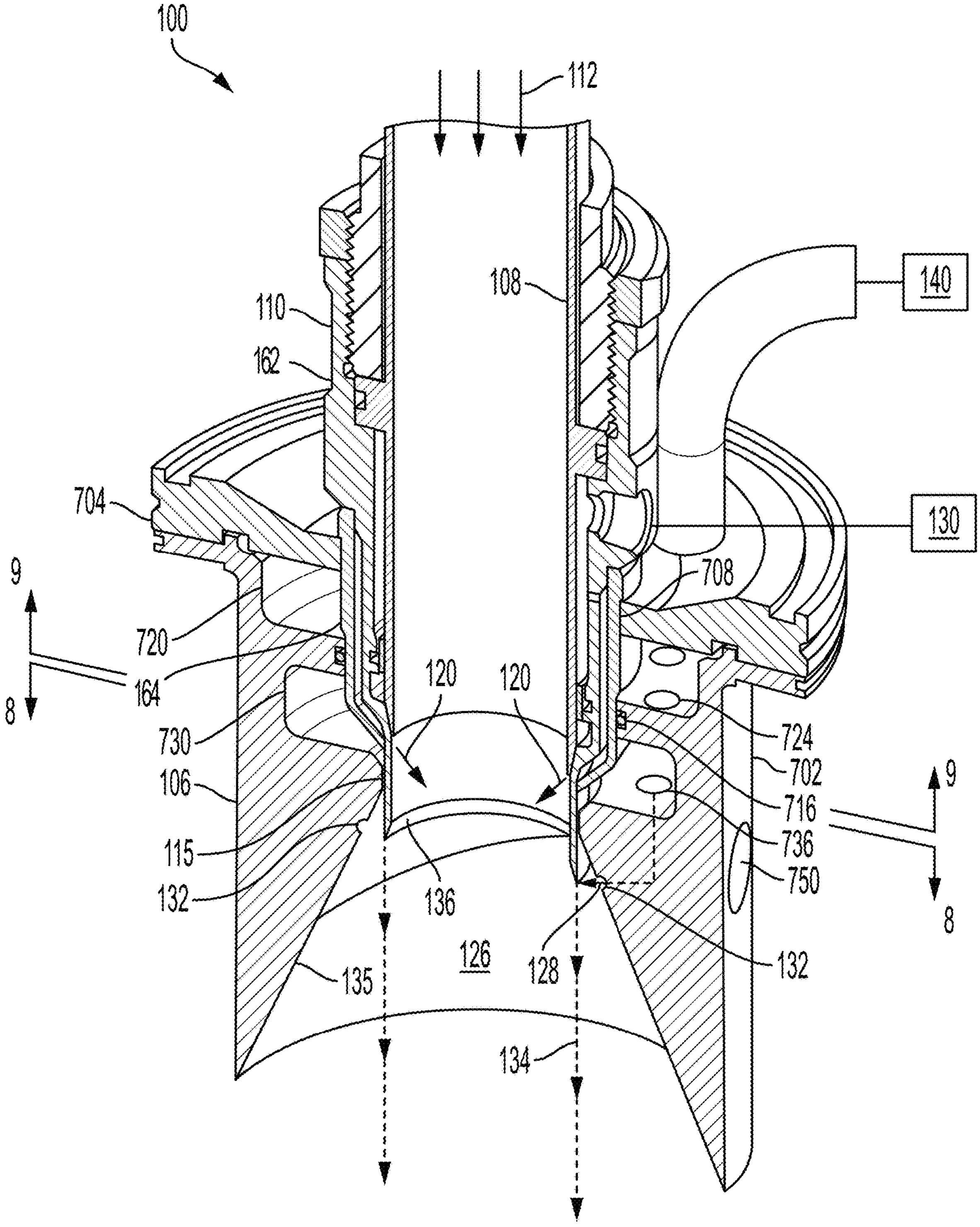
FIG. 7 depicts a cross-sectional isometric view of an injector for an abatement system in accordance with at least some embodiments of the present disclosure.

FIG. 7 depicts a schematic isometric cross-sectional view of an injector 100 for an abatement system in accordance with at least some embodiments of the present disclosure. In some embodiments, the containment tube 106 includes a cylindrical body 702 coupled to a top plate 704 having a central opening 708 to accommodate the inlet tube 102. In some embodiments, the cylindrical body 702 and the top plate 704 define a first plenum 720. The liquid source 140 is fluidly coupled to the first plenum 720 to provide liquid to the one or more first liquid nozzles 115 and the one or more second liquid nozzles 132.

In some embodiments, the first plenum 720 is fluidly coupled to a second plenum 730 formed between the cylindrical body 702 and the inlet tube 102 via a plurality of ports 724 to aid in uniformly distributing the liquid. As such, liquid is supplied to the one or more first liquid nozzles 115 via the first plenum 720, the plurality of ports 724, the second plenum 730 and through a gap between the second plenum 730 and an outer surface of the outer wall 110. In some embodiments, a centering feature 716 is disposed between the inlet tube 102 and the containment tube 106 to align the inlet tube 102 with the containment tube 106 so that the first liquid membrane 134 forms a more uniform cylinder. In some embodiments, the centering feature 716 comprises a plastic ring. In some embodiments, the centering feature 716 is disposed between the first plenum 720 and the second plenum 730.

In some embodiments, the second plenum 730 includes a plurality of second ports 736. The plurality of second ports 736 extend to respective ones of the one or more second liquid nozzles 132. The one or more second liquid nozzles 132 may direct fluid tangentially to the inner sidewalls 135 of the containment tube 106 to create the second liquid membrane 128 in a centrifugal manner. In some embodiments, the plurality of ports 724 are greater in number than the plurality of second ports 736. In some embodiments, the one or more second liquid nozzles 132 are machined into the containment tube 106. In some embodiments, one or more plugs 750 corresponding with a number of the one or more second liquid nozzles 132 are coupled to the containment tube 106 after machining the one or more second liquid nozzles 132. In some embodiments, as depicted in FIG. 7, the upper tube 162 of the outer wall 110 defines the forming tip 136.

Figure 8:
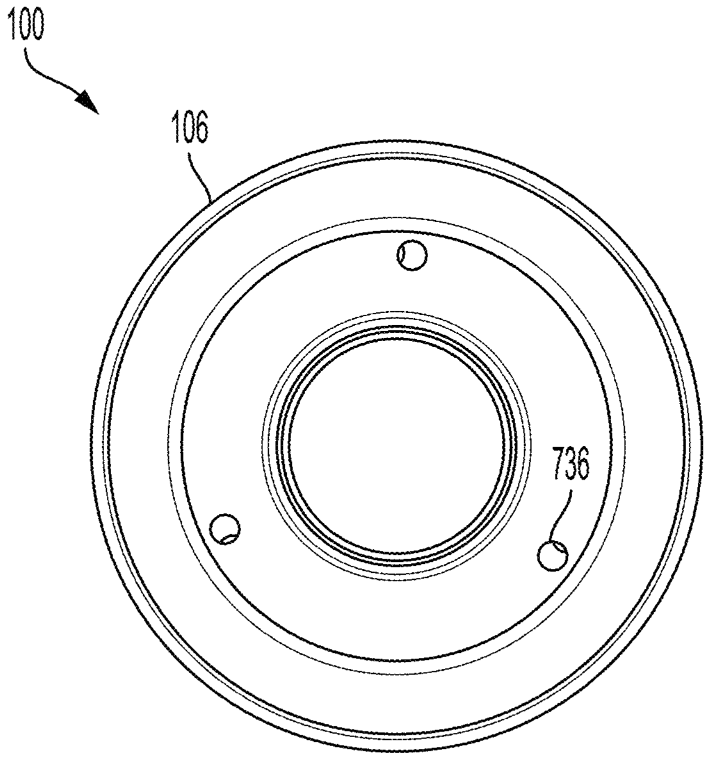
FIG. 8 depicts a top view of an injector for an abatement system taken along line 8-8 of FIG. 7 in accordance with at least some embodiments of the present disclosure.
Figure 9:
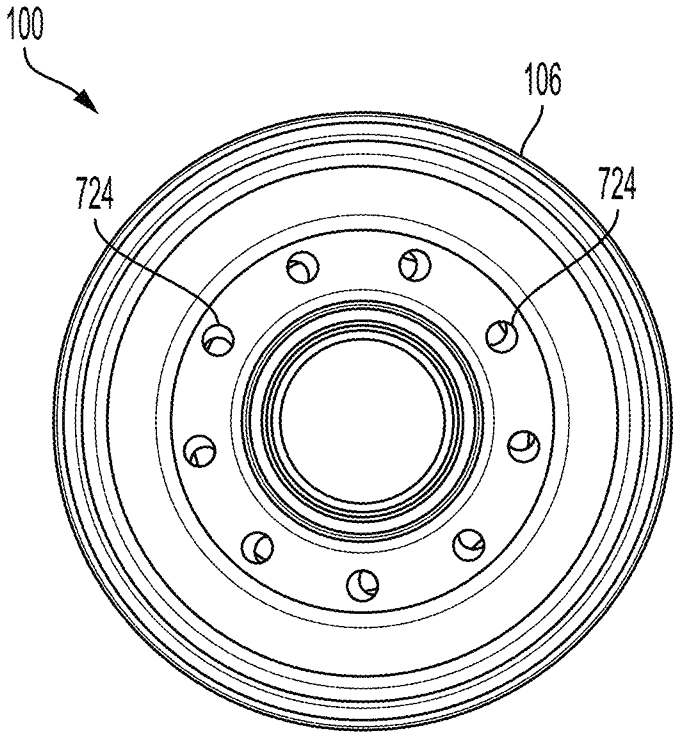
FIG. 9 depicts a bottom view of an injector for an abatement system taken along line 9-9 of FIG. 7 in accordance with at least some embodiments of the present disclosure.

FIG. 8 depicts a top view of an injector 100 for an abatement system taken along a second plenum in accordance with at least some embodiments of the present disclosure. FIG. 9 depicts a top view of an injector for an abatement system take along a first plenum in accordance with at least some embodiments of the present disclosure. In some embodiments, the one or more second liquid nozzles 132 comprise about 3 to about 10 nozzles, corresponding with about 3 to about 10 second ports of the plurality of second ports 736 (3 shown in FIG. 8). In some embodiments, the plurality of ports 724 comprise about 6 to about 12 ports (9 shown in FIG. 9).

Figure 10:
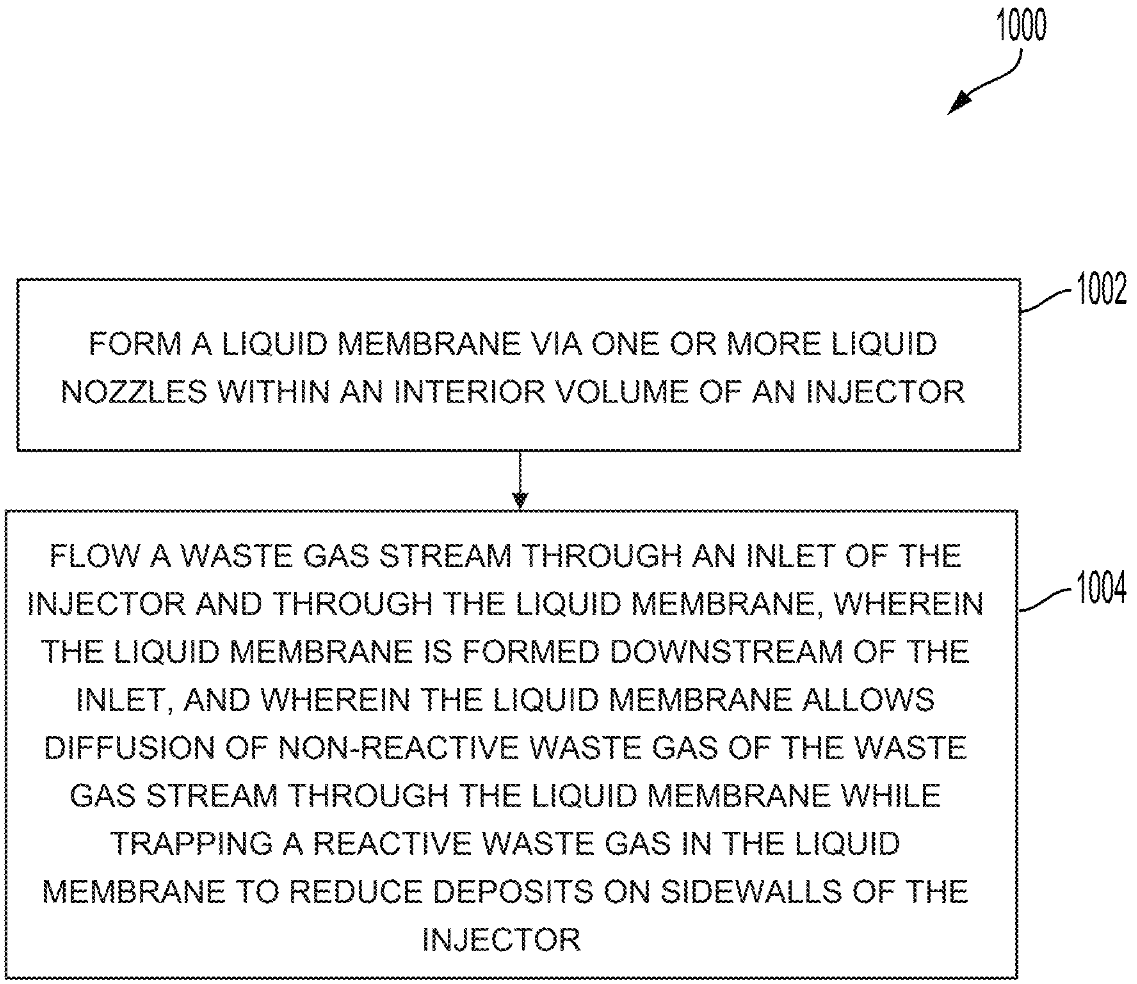
FIG. 10 depicts a flow diagram of a method of abating liquid soluble waste gases and byproducts from a chemical or industrial process in accordance with at least some embodiments of the present disclosure.

FIG. 10 depicts a flow chard of a method 1000 of abating liquid soluble waste gases and byproducts from a chemical or industrial process in accordance with at least some embodiments of the present disclosure. At 1002, the method includes forming a liquid membrane (e.g., first liquid membrane 134) via one or more liquid nozzles (e.g., one or more first liquid nozzles 115) within an interior volume (e.g., interior volume 126 of an injector (e.g., injector 100).

At 1004, the method 1000 includes flowing a waste gas stream (e.g., waste gas stream 112) through an inlet (e.g., waste gas inlet 104) of the injector and through the liquid membrane, wherein the liquid membrane is formed downstream of the inlet, and wherein the liquid membrane allows diffusion of non-reactive waste gas of the waste gas stream through the membrane while trapping a reactive waste gas in the liquid membrane to reduce deposits on sidewalls of the injector. The non-reactive waste gas may be hydrogen gas, or the like.

In some embodiments, the method 1000 includes flowing a first gas downward, radially inward, or downward and radially inward downstream of the inlet prior to flowing the waste gas stream to create a compression zone (e.g., compression zone 118) for the waste gas stream to delay interaction between the waste gas stream and the liquid membrane. A location of the initial interaction between the waste gas stream and the liquid membrane may be controlled by controlling a pressure or flow rate of the first gas. In some embodiments, the method 1000 includes flowing a second gas into a region (e.g., region 150) between the compression zone and the liquid membrane to prevent creation of vacuum or low pressure between the compression zone and the liquid membrane. In some embodiments, the second gas has substantially the same composition as the first gas. In some embodiments, the first gas consists essentially of an inert gas such as nitrogen or argon.

In some embodiments, the method 1000 includes heating the first gas to a temperature greater than the temperature of the liquid membrane prior to flowing the first gas. In some embodiments, the method 1000 includes forming a second liquid membrane (e.g., second liquid membrane 128)

between the liquid membrane and an inner sidewall (e.g., inner sidewalls 135) of the injector prior to flowing the waste gas stream. In some embodiments, the second liquid membrane is formed in a spiral pattern that flows proximate the inner sidewall of the injector. In some embodiments, the second liquid membrane flows down the inner sidewall of the injector with no spiral pattern. In some embodiments, the waste gas stream includes at least one of trichlorosilane, dichlorosilane, tetraethoxysilane, arsine, anhydrous ammonia, trimethylphosphine, trimethylaluminum, or tungsten.

While the foregoing is directed to embodiments of the present disclosure, other and further embodiments of the disclosure may be devised without departing from the basic scope thereof.

The invention claimed is:

1. An injector for an abatement system, comprising:

an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends to the gap between the inner wall and the outer wall to one or more first gas nozzles configured to inject a first inert gas into the waste gas stream in a downward, radially inward, or downward and radially inward direction to create a compression zone for the waste gas stream; and a containment tube coupled to the inlet tube and disposed about the second end of the inlet tube, wherein the containment tube includes a liquid inlet port that is fluidly coupled to one or more first liquid nozzles configured to create a first liquid membrane in an interior volume of the containment tube and one or more second liquid nozzles configured to create a second liquid membrane in the interior volume radially outward of the first liquid membrane, wherein the containment tube includes a cylindrical body coupled to a top plate having a central opening to accommodate the inlet tube, and wherein the cylindrical body and the top plate define a first plenum, wherein the first plenum is fluidly coupled to a second plenum formed between the cylindrical body and the inlet tube via a plurality of ports, and wherein the one or more second liquid nozzles are fluidly coupled to the second plenum.

2. The injector of claim 1, wherein the inlet tube includes one or more second gas nozzles disposed radially outward of the one or more first gas nozzles configured to inject a second inert gas into a region between the compression zone and the first liquid membrane.

3. The injector of claim 1, wherein the containment tube includes a spiral channel, and the second liquid membrane is formed via liquid flowing through the spiral channel.

4. The injector of claim 1, further comprising a mounting tube coupled to a lower end of the containment tube, wherein the mounting tube includes a lower flush nozzle and a bend.

5. The injector of claim 1, wherein a diameter of the first liquid membrane is similar to a diameter of the second end of the inlet tube.

6. An injector for an abatement system, comprising:

an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends to the gap between the inner wall and the outer wall to one or more first gas nozzles configured to inject a first inert gas into the waste gas stream in a downward, radially inward, or downward and radially inward direction to create a compression zone for the waste gas stream; and a containment tube coupled to the inlet tube and disposed about the second end of the inlet tube, wherein the containment tube includes a liquid inlet port that is fluidly coupled to one or more first liquid nozzles configured to create a first liquid membrane in an interior volume of the containment tube and one or more second liquid nozzles configured to create a second liquid membrane in the interior volume radially outward of the first liquid membrane, wherein the liquid inlet port that is fluidly coupled to the one or more first liquid nozzles via a plurality of distribution ports disposed radially inward of the liquid inlet port.

7. An injector for an abatement system, comprising:

an inlet tube having an inner wall and an outer wall and a gap disposed therebetween, wherein the inner wall defines a flow path therein for a waste gas stream from a waste gas inlet at a first end of the inlet tube to a waste gas outlet at a second end of the inlet tube, wherein the inlet tube includes an inert gas inlet that extends to the gap between the inner wall and the outer wall to one or more first gas nozzles configured to inject a first inert gas into the waste gas stream in a downward, radially inward, or downward and radially inward direction to create a compression zone for the waste gas stream; and a containment tube coupled to the inlet tube and disposed about the second end of the inlet tube, wherein the containment tube includes a liquid inlet port that is fluidly coupled to one or more first liquid nozzles configured to create a cylindrical liquid curtain in an interior volume of the containment tube to provide a liquid barrier for the waste gas stream downstream of the inlet tube, and wherein the liquid inlet port is fluidly coupled to one or more second liquid nozzles configured to flow a liquid along an inner sidewall of the containment tube downstream of the inlet tube, wherein the containment tube includes a cylindrical body coupled to a top plate having a central opening to accommodate the inlet tube, wherein the cylindrical body and the top plate define a first plenum, wherein the first plenum is fluidly coupled to a second plenum formed between the cylindrical body and the inlet tube via a plurality of ports, and wherein the one or more second liquid nozzles are fluidly coupled to the second plenum.

8. The injector of claim 7, wherein the one or more second liquid nozzles comprise 3 to 10 nozzles.

9. The injector of claim 7, further comprising an insulation barrier disposed between inert gas inlet and the liquid inlet port.

10. The injector of claim 7, further comprising a mounting tube coupled to a lower end of the containment tube, wherein the mounting tube includes at least one of a spin flush nozzle or a cone flush nozzle.

11. A method of abating liquid soluble waste gases and byproducts from a chemical or industrial process, comprising:

forming a liquid membrane via one or more liquid nozzles within an interior volume of the injector of claim 1; and flowing a waste gas stream through an inlet of the injector and through the liquid membrane, wherein the liquid membrane is formed downstream of the inlet, and wherein the liquid membrane allows diffusion of non-reactive waste gas of the waste gas stream through the liquid membrane while trapping a reactive waste gas in the liquid membrane to reduce deposits on sidewalls of the injector.

12. The method of claim 11, further comprising flowing a first gas downward, radially inward, or downward and radially inward downstream of the inlet prior to flowing the waste gas stream to create a compression zone for the waste gas stream to delay interaction between the waste gas stream and the liquid membrane.

13. The method of claim 12, further comprising flowing a second gas into a region between the compression zone and the liquid membrane.

14. The method of claim 12, further comprising heating the first gas to a temperature greater than a temperature of the liquid membrane prior to flowing the first gas.

15. The method of claim 11, further comprising forming a second liquid membrane between the liquid membrane and an inner sidewall of the injector prior to flowing the waste gas stream.

16. The method of claim 15, wherein the second liquid membrane is formed in a spiral pattern that flows proximate the inner sidewall of the injector.

17. The method of claim 11, wherein the waste gas stream includes at least one of trichlorosilane, dichlorosilane, tetraethoxysilane, arsine, anhydrous ammonia, trimethylphosphine, trimethylaluminum, hydrochloric acid, or tungsten.

* * * * *